(12) United States Patent
Lai

(10) Patent No.: US 6,790,335 B2
(45) Date of Patent: Sep. 14, 2004

(54) METHOD OF MANUFACTURING DECORATIVE PLATE

(75) Inventor: Wente Lai, Tu-chen (TW)

(73) Assignee: Hon Hai Precision Ind. Co., LTD, Taipei Hsien (TW)

(*) Notice: Subject to any disclaimer, the term of this patent is extended or adjusted under 35 U.S.C. 154(b) by 0 days.

(21) Appl. No.: 10/334,522

(22) Filed: Dec. 31, 2002

(65) Prior Publication Data

US 2004/0094426 A1 May 20, 2004

(51) Int. Cl.⁷ ................................................. C25D 5/34
(52) U.S. Cl. .................... 205/205; 205/120; 205/316; 205/333; 205/324; 205/221; 205/188; 205/135; 427/248.1; 427/255.28

(58) Field of Search .................................. 205/120, 316, 205/333, 324, 221, 205, 188, 135; 427/248.1, 255.28

(56) References Cited

U.S. PATENT DOCUMENTS 5,062,928 A * 11/1991 Smith ......................... 205/135
5,681,439 A * 10/1997 Lee ............................. 205/50
5,820,740 A * 10/1998 Le et al. ..................... 205/171

* cited by examiner

Primary Examiner—Wesley A. Nicolas
(74) Attorney, Agent, or Firm—Wei Te Chung

(57) ABSTRACT

A method of manufacturing a decorative plate (1) includes the steps of: preparing a metal substrate and covering selected areas (11, 16) of the substrate with a protective film; anodizing the substrate; and removing the protective film to expose metallic surfaces in the selected areas of the substrate.

15 Claims, 3 Drawing Sheets

METHOD OF MANUFACTURING DECORATIVE PLATE

FIELD OF THE INVENTION

The present invention relates to a method of manufacturing a decorative plate, and particularly to a method of manufacturing a decorative plate with an anodic oxide film thereon.

BACKGROUND OF THE INVENTION

A decorative plate can be used as a commemorative plaque, a trophy plate, or as a part of another device, for instance, as a front cover of a portable electronic device. Conventional methods to produce decorative plates include etching and electroplating. The etching method mainly comprises the steps of: forming a metal substrate, printing a desired pattern on the metal substrate in ink and drying the pattern, and etching the metal substrate in the areas without ink using an etching agent, thus forming a stereoscopic ink pattern on the surface of the metal substrate. However, it is easy to form trickling traces on the surface of the metal substrate when the etching agent etches the metal substrate, and the quality of the formed pattern is not good. The electroplating method, which is described in Chinese application publication No. CN1105071, includes the steps of: polishing and washing a metal substrate, printing an ink pattern on the metal substrate, and plating the metal substrate to form a metallic layer on the ink pattern. However, electroplating the metallic layer is relatively expensive. Additionally, the patterns formed by the two conventional methods above both use ink patterns, and the adhesion between the ink and the substrates can be a problem.

Therefore, an improved method for manufacturing a decorative plate is desired which overcomes the disadvantages of the prior art.

SUMMARY OF THE INVENTION

A main object of the present invention is to provide a method of manufacturing a decorative plate which yields a more brilliant pattern than which is manufactured by conventional methods.

Another object of the present invention is to provide a method to manufacture a decorative plate which yields a brilliant pattern firmly combining with the substrate of the decorative plate.

A method of manufacturing a decorative plate includes the steps of: preparing a substrate and covering selected areas of the substrate with a protective film; anodizing the substrate; and removing the protective film, to expose metallic surfaces in the selected areas of the substrate.

Other objects, advantages and novel features of the invention will become more apparent from the following detailed description of a preferred embodiment thereof when taken in conjunction with the accompanying drawings, wherein:

DETAILED DESCRIPTION OF THE INVENTION

Figure 1:
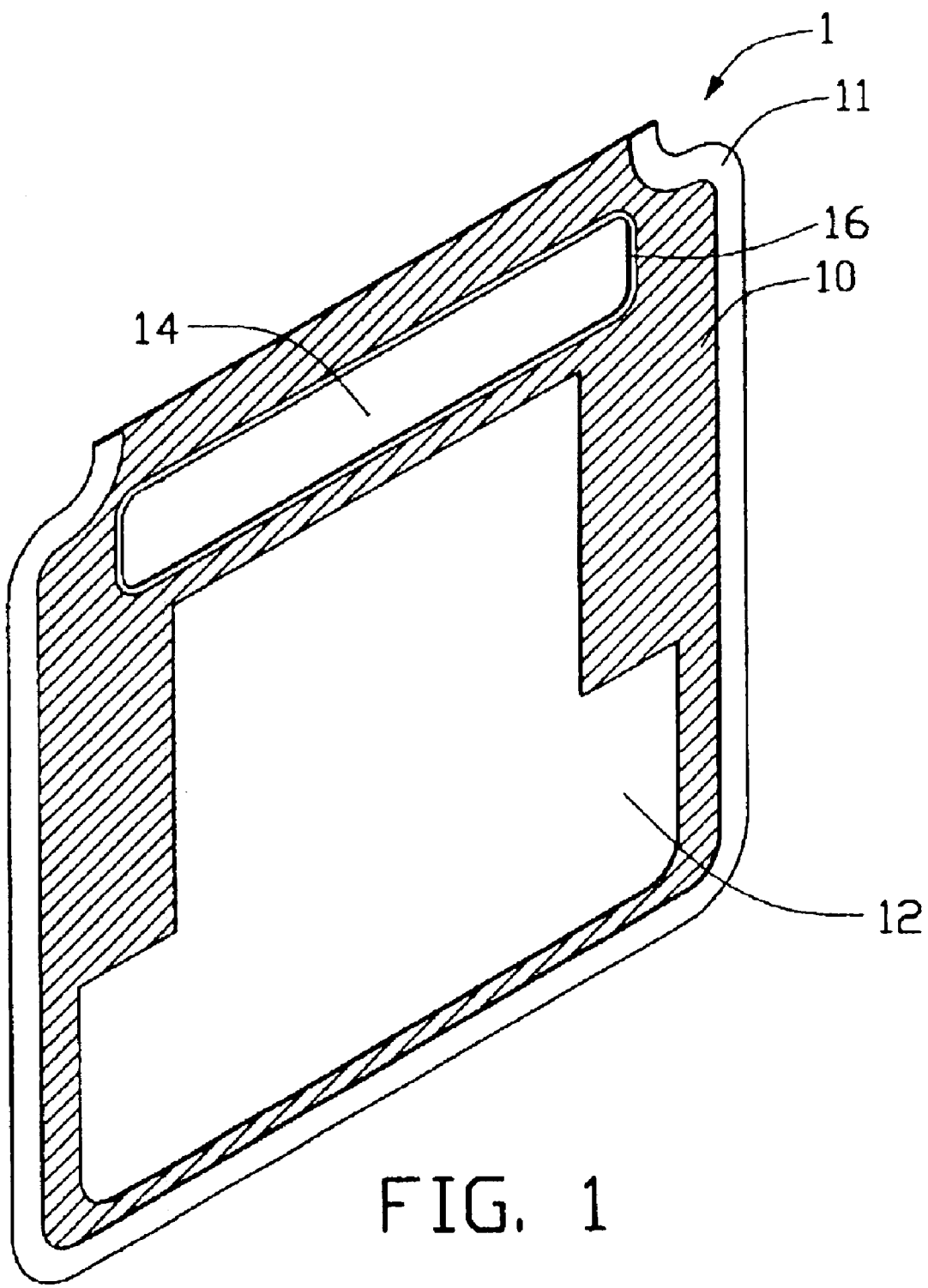
FIG. 1 is a perspective view of a decorative plate in accordance with a preferred embodiment of the present invention.
Figure 2:
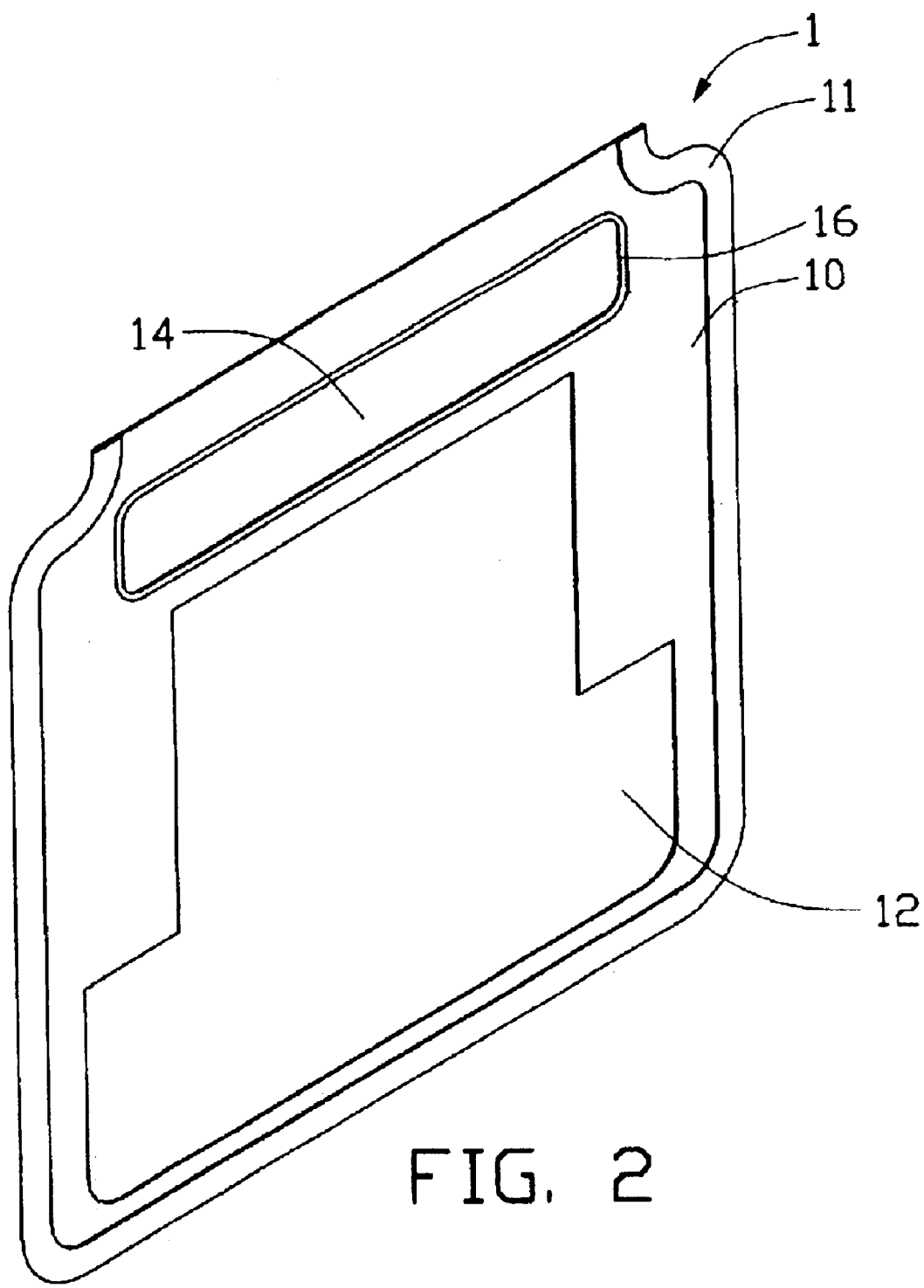
FIG. 2 is a perspective view of the decorative plate of FIG. 1 before anodization.
Figure 3:
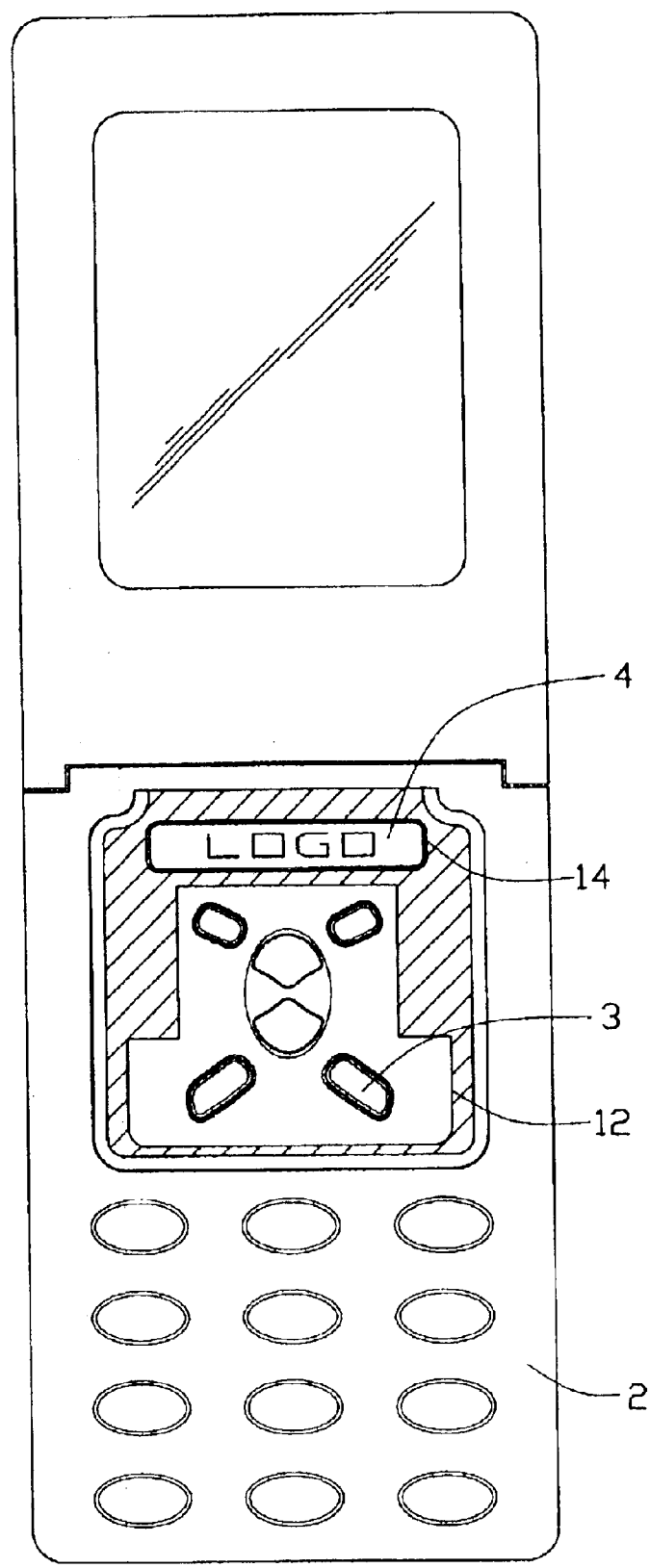
FIG. 3 is a plan view of the decorative plate of FIG. 1 as assembled on a mobile phone.

Referring now to the drawings in detail, FIG. 1 shows a decorative plate 1 made by a method in accordance with a preferred embodiment of the present invention. The decorative plate 1 includes a base 10 having an edge trim 11 and defining a first opening 12 and a second opening 14. The second opening 14 is bordered by a fringe 16. The two openings 12 and 14 are made according to use requirements of the decorative plate 1, and other openings can be made to satisfy different requirements. In FIG. 1, the base 10 is anodized and colored to form a colorful pattern on a central surface (not labeled) of the base 10, while the edge trim 11 and the fringe 16 retain their untreated metallic surfaces. FIG. 2 shows the decorative plate 1 of FIG. 1 before anodization, wherein the edge trim 11 and the fringe 16 are covered with printing ink (not labeled). FIG. 3 shows the decorative plate 1 of FIG. 1 after it has been assembled to a mobile phone 2. A plurality of operating keys 3 extend from the first opening 12, and a label 4, which is composed of figures, letters, patterns, signs or their combination, is visible through the second opening 14. Because of the characteristics of the anodization process, the colored anodic oxide film or pattern on the surface of the base 10 is brilliant, hard, adherent, smooth and erosion resistant. In addition, the metallic surfaces of the edge trim 11 and the fringe 16 have a high luster. So the mobile phone 2 decorated with the decorative plate 1 is more attractive to a user.

A method of manufacturing the decorative plate 1 of FIG. 1 comprises the steps of:

(1) preparing a metal substrate and covering selected areas of the metal substrate with a protective film;

(2) anodizing the metal substrate;

(3) removing the protective film, thus exposing the metal substrate in the selected areas; and (4) stamping the metal substrate, thus forming holes in and edge contours of the decorative plate 1, as in FIG. 1.

In the first step, a piece of metal sheet is cut into a plurality of metal substrates about the size of the decorative plate 1. Then, the metal substrates are pretreated, which includes mechanical polishing, degreasing, chemical polishing, washing and drying the metal substrates. After that, selected areas of each metal substrate are covered with a protective film. The selected areas as shown in FIG. 2 include the edge trim 11 and the fringe 16. The method for applying the protective film is a silk screening method, and the protective film is an acid-resistant, printing ink film. Therefore the selected areas of the metal substrate covered by the protective film will not be anodized in the second step. If areas of the metal substrate without the protective film have been oxidized, an etching process is desired to remove the oxide film thereon.

In the second step, the metal substrate is dipped into an electrolytic cell containing sulfuric acid, and direct current power is applied to the electrolytic cell. During the anodizing process, a concentration of the sulfuric acid in the electrolytic cell is in a range of 100 to 200 g/L, a voltage of the direct current power applied to the electrolytic cell is between 8V and 16 V, and a current density of the direct current power is between 100.0 A/m$^2$ and 200.0 A/m$^2$. The anodization is carried out for 30 to 60 minutes, until an anodic oxide film is formed on the surface of the areas of the metal substrate without the protective film, and a thickness of the anodic oxide film is in a range of 8 $\mu$m to 20 $\mu$m. To form a colored metal substrate, a coloring process is needed.

After being anodized, the metal substrate is washed, dried, and then soaked in a dyeing bath containing organic dyes to color the anodic oxide film. A concentration of the organic dyes is between 1 g/L to 10 g/L. The dyeing process is performed for 5 to 20 minutes. Various organic dyes can be used according to the desired colors of the anodized surface of the metal substrate. For instance, if the organic dyes are composed of aluminum red GLW and aluminum violet CLW, the color of the anodized surface of the metal substrate will be red. Other conventional coloring methods, such as electrolytic coloring, integral coloring, or inorganic dye coloring, can be used to color the anodic oxide film. Thereafter, the anodized surface of the metal substrate is sealed in boiling water.

In the third step, a conventional solvent, such as methylbenzene, is used to wash away the printing ink film, thus removing the protective film and exposing the metal substrate in the selected areas of the metal substrate.

In the fourth step, the metal substrate is stamped using usual processes to form the edge and openings of the decorative plate 1. The decorative plate 1 in FIG. 1 has two openings 12 and 14, and the edge trim 11 and the fringe 16 both have clear and neat metallic surfaces.

Further optional steps, for preventing the metallic surfaces of the edge trim 11 and the fringe 16 from being oxidized, can also be used, such as depositing a chromium (Cr) or chromium-containing layer on the metallic surface, if desired. Specifically, a layer of chromium carbide, chromium nitride (CrN) or chromium carbonitride can be applied using a CVD (Chemical Vapor Deposition) or PVD (Physical Vapor Deposition) method. In a preferred embodiment, a CrN layer is deposited using a PVD method. The PVD is carried out in a vacuum chamber. First, the decorative plate 1 of FIG. 1 is placed in the vacuum chamber for cleaning before deposition. A glow discharge cleaning step is used, which includes: first charging the vacuum chamber with an inert gas, such as argon, to a pressure between $7.0 \times 10^{-3}$ Pa and $9.0 \times 10^{-3}$ Pa, and then applying a bias voltage in a range of −950 volts to −1100 volts to the decorative plate 1 to initiate an abnormal glow discharge. The impingement of argon ions onto the decorative plate 1 during this glow discharge cleans the metallic surfaces to be deposited. If desired, a further cleaning step can be used, which is effected by decreasing the pressure to between $4.0 \times 10^{-3}$ Pa and $6.0 \times 10^{-3}$ Pa, and bombarding the metallic surfaces of the decorative plate 1 with chromium ions from a target to sputter clean the metallic surfaces. During the two cleaning steps, the bias voltage difference between the decorative plate 1 and ground is kept high, at −950 to −1100 volts. After the metallic surfaces of the edge trim 11 and the fringe 16 are thoroughly cleaned, the deposition of the CrN coating can be performed, in which the bias voltage difference is reduced to a range of 0 volts to −500 volts, and nitrogen is introduced into the vacuum chamber. The nitrogen reacts with chromium ions to form CrN, which is deposited on the metallic surfaces. Still, the ratio of argon to nitrogen, in effect the partial pressure of argon, must be maintained at a restricted level to minimize the deposition of Cr, partially reacted Cr, and possibly $Cr_2N$. Preferably the ratio of argon to nitrogen is less than 1. Deposition in nitrogen alone is preferred. The CrN layer is applied to a thickness of about 1 to 10 microns. During the PVD process, the anodized base 10 of the decorative plate 1 must be protected from deposition.

The step of depositing a chromium or chromium-containing layer can also be performed in the first step after pretreating the metal substrate. Thus the chromium or chromium-containing layer can be deposited on the selected areas of the metal substrate, and the protective film then covers over the chromium or chromium-containing layer.

It is understood that applying a clear paint or other covering on the metallic surfaces of the edge trim 11 and the fringe 16 can also prevent them from being oxidized.

The fourth step can also be carried out in the first step, that is, preparing the metal substrate in the first step can include cutting and stamping the metal sheet into the final contour of the decorative plate 1. It is understood that the fourth step can also be performed at a part of the other three steps.

The decorative plate 1 can be made from a metal substrate, as described above, or can be a plastic base formed by injection molding with a metallic covering thereon.

In another preferred embodiment of the present invention, the method of manufacturing the decorative plate 1 of FIG. 1 comprising four corresponding steps as described above, wherein in the first step, a piece of metal sheet as a metal substrate is pretreated and covered on selected areas of the metal sheet with a protective film, and then anodizing the metal sheet in the second step, removing the protective film to expose the selected areas of the metal substrate in the third step, and cutting and stamping the metal substrate to the decorative plate 1 of FIG. 1 in the fourth step.

Compared to conventional methods, the method of the present invention can form a decorative plate 1 with an anodized and colored pattern on the central surface of the base 10 and with an edge trim 11 and a fringe 16 having metallic surface, therefore, the decorative plate 1 exhibits a bright, silver-like luster, which provides a more brilliant decorative effect when assembled to a mobile phone 2 by an adhesive or other mechanical means, as shown in FIG. 3. Additionally, the formed pattern on the decorative plate 1 using the method of the present invention is an anodic oxide film of the base 10, and it firmly combines with the base 10 as a part of it, thus, it is difficult to peel the pattern off the base 10 of the decorative plate 1.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A method of manufacturing a decorative plate comprising the steps of:
   preparing a substrate;
   covering selected areas thereof with a protective film;
   anodizing the substrate; and
   removing the protective film to expose metallic surfaces in the selected areas of the substrate; wherein
   a step of depositing a chromium or chromium-containing layer on the selected areas of the substrate is further involved after preparing the substrate or after removing the protective film to expose metallic surfaces in the selected areas of the substrate.

2. The method of manufacturing a decorative plate as claimed in claim 1, wherein the protective film is a printing ink film formed by a silk screen process.

3. The method of manufacturing a decorative plate as claimed in claim 1, wherein after anodization, the substrate is colored by electrolytic coloring, dye coloring or integral coloring.

4. The method of manufacturing a decorative plate as claimed in claim 1, wherein a stamping step is further involved.

5. The method of manufacturing a decorative plate as claimed in claim 1, wherein the protective film is removed by washing in a solvent.

6. The method of manufacturing a decorative plate as claimed in claim 1, wherein the chromium or chromium-containing layer is formed using a physical vapor deposition process in a vacuum chamber.

7. The method of manufacturing a decorative plate as claimed in claim 6, wherein the chromium-containing layer is a chromium nitride layer.

8. The method of manufacturing a decorative plate as claimed in claim 7, wherein the physical vapor deposition process includes a glow discharge cleaning step using an insert gas, and wherein a pressure in the vacuum chamber is between $7.0 \times 10^{-3}$ Pa and $9.0 \times 10^{-3}$ Pa, and a bias voltage applied to the decorative plate is in a range of $-950$ volts to $-1100$ volts.

9. The method of manufacturing a decorative plate as claimed in claim 8, wherein the physical vapor deposition process further includes a chromium ion sputter cleaning step, and wherein a pressure in the vacuum chamber is between $4.0 \times 10^{-3}$ Pa and $6.0 \times 10^{-3}$ Pa, and a bias voltage applied to the decorative plate is in a range of $-950$ volts to $-1100$ volts.

10. The method of manufacturing a decorative plate as claimed in claim 8, wherein for the deposition of chromium nitride, nitrogen is introduced into the vacuum chamber after the cleaning step, the ratio of the inert gas to nitrogen is less than 1, and a bias voltage applied to the decorative plate is in a range of 0 volts to $-500$ volts.

11. The method of manufacturing a decorative plate as claimed in claim 10, wherein the deposition of chromium nitride is carried out in nitrogen alone.

12. The method of manufacturing a decorative plate as claimed in claim 1, wherein after removing the protective film, applying a clear paint or other covering on the metallic surfaces in the selected areas of the substrate.

13. A method of manufacturing a decorative plate comprising the steps of:

preparing a metal substrate;

covering selected areas of the metal substrate with a protective film;

anodizing and coloring the metal substrate; and removing the protective film to expose metallic surfaces in the selected areas of the substrate; wherein a step of depositing a chromium or chromium-containing layer onto the selected areas of the substrate using a physical vapor deposition process or a chemical vapor deposition process is further involved after preparing the substrate or after removing the protective film to expose metallic surfaces in the selected areas of the substrate.

14. The method of manufacturing a decorative plate as claimed in claim 13, wherein the protective film is a printing ink film formed by a silk screen process, and the protective film is removed by washing in a solvent.

15. The method of manufacturing a decorative plate as claimed in claim 13, wherein a stamping step is further involved.

* * * * *